United States Patent [19]
Gibbons

[11] Patent Number: 6,095,345
[45] Date of Patent: Aug. 1, 2000

[54] ELECTRONICS RACK ALIGNMENT STRUCTURES

[75] Inventor: Clifford A. Gibbons, Round Rock, Tex.

[73] Assignee: Dell USA L P, Round Rock, Tex.

[21] Appl. No.: 09/177,649

[22] Filed: Oct. 22, 1998

[51] Int. Cl.$^7$ ................................................. A47F 5/00
[52] U.S. Cl. ..................... 211/26; 211/190; 312/265.4; 361/829
[58] Field of Search ............................. 211/26, 151, 187, 211/190; 312/265.1, 265.2, 265.3, 265.4, 265.5; 361/724, 829, 807, 810

[56] References Cited

U.S. PATENT DOCUMENTS

| | | | |
|---|---|---|---|
| 3,900,112 | 8/1975 | Azzi et al. ........................... | 211/151 X |
| 4,103,852 | 8/1978 | Fisk ...................................... | 248/178 |
| 4,203,373 | 5/1980 | Conti .................................... | 108/152 |
| 4,453,641 | 6/1984 | Rasmussen et al. .................. | 211/151 |
| 4,454,948 | 6/1984 | Spamer ................................. | 211/49 |
| 4,921,103 | 5/1990 | Cohen ................................... | 206/523 |
| 5,142,445 | 8/1992 | Sorensen et al. .................... | 361/391 |
| 5,165,770 | 11/1992 | Hahn ................................... | 211/26 X |
| 5,193,890 | 3/1993 | Robertson, Jr. et al. ............. | 312/7.1 |
| 5,199,585 | 4/1993 | Schafer ................................. | 211/187 |
| 5,236,259 | 8/1993 | Ryan et al. .......................... | 312/244 |
| 5,312,005 | 5/1994 | Odell .................................... | 211/26 X |
| 5,325,263 | 6/1994 | Singer et al. ........................ | 361/683 |
| 5,388,032 | 2/1995 | Gill et al. ............................. | 364/146 |
| 5,450,968 | 9/1995 | Bustos .................................. | 211/59.2 |
| 5,460,441 | 10/1995 | Hastings et al. ..................... | 312/298 |
| 5,505,533 | 4/1996 | Kammersqard et al. ............. | 312/236 |
| 5,508,891 | 4/1996 | Rowe et al. ......................... | 361/833 |
| 5,510,955 | 4/1996 | Taesang .............................. | 361/685 |
| 5,513,068 | 4/1996 | Girard .................................. | 361/685 |
| 5,526,944 | 6/1996 | Merl ..................................... | 211/87 |
| 5,542,549 | 8/1996 | Siemon et al. ...................... | 211/26 |
| 5,566,049 | 10/1996 | Nguyen ............................... | 361/685 |
| 5,571,256 | 11/1996 | Good et al. ......................... | 211/151 X |
| 5,586,003 | 12/1996 | Schmitt et al. ..................... | 361/683 |
| 5,592,886 | 1/1997 | Williams et al. ................... | 108/108 |
| 5,654,873 | 8/1997 | Smithson et al. ................... | 361/685 |
| 5,673,172 | 9/1997 | Hastings et al. ..................... | 361/685 |
| 5,682,291 | 10/1997 | Jeffries et al. ...................... | 361/1.85 |
| 5,746,488 | 5/1998 | LaCour ............................... | 312/196 |
| 5,747,734 | 5/1998 | Kozlowski et al. ................. | 174/50 |
| 5,791,498 | 8/1998 | Mills ................................... | 211/26 |

*Primary Examiner*—Robert W. Gibson, Jr.
*Attorney, Agent, or Firm*—Skjerven Morrill MacPherson Franklin & Friel LLP; David G. Dolezal

[57] ABSTRACT

A mounting bracket for an electronics rack having a rack structure defining a plurality of holes spaced along the rack structure to define retma (U) mounting unit increments of the rack. The plurality of holes are spaced along the vertical rack structure in a pattern substantially conforming to an Electronics Industry Association (EIA) standard. The mounting bracket includes a mounting bracket body, a first alignment structure extending from the mounting bracket body, and a second alignment structure extending from the mounting bracket body. The first alignment structure and the second alignment structure each are adapted to engage a hole of the rack structure so as to align the bracket in a position along the rack structure. The first alignment structure and the second alignment structure being spaced apart such that the bracket is alignable along the rack structure both at positions corresponding to whole retma unit increments and at positions corresponding to half retma unit increments. Electronic devices such as computer system servers may be mounted in the rack.

49 Claims, 10 Drawing Sheets

ELECTRONICS RACK ALIGNMENT STRUCTURES

BACKGROUND OF THE INVENTION

1. Field of the Invention

This invention relates in general to electronic devices and in particular to alignment structures for electronics racks.

2. Description of the Related Art

Electronic devices such as computer systems can be mounted in an electronics rack to save floor space. An electronics rack can house an number of electronic devices made by different electronics manufactures. Consequently, the height, width, and depth of the electronic devices housed in the rack may conform to specific standards such as the Electronics Industry Association (EIA) RS-310 19" rack standard so as to enable the devices to be mounted in an electronics rack conforming to the standard.

Electronics racks conforming to a standard have definable vertical mounting unit increments. An example of a definable mounting unit increment is a retma (U) unit for an electronics rack conforming to the EIA standard. The height of electronic devices conforming to the standard is typically sized in mounting unit increments to allow for the efficient utilization of rack space and the standardization of rack structures.

Because electronics racks conforming to EIA standards are designed to house electronic devices of various heights, vertical rack structures of an electronics rack may include mounting holes that run along the entire vertical rack structure enabling horizontal rack structures to be mounted at positions corresponding to retma unit increments. During the assembly of a rack, alignment of a horizontal structure to a particular position corresponding to a mounting unit increment can be difficult due to the large number of holes of the vertical structure.

Referring to FIG. 1, to aid in alignment of a horizontal rail (or other rack structure) during assembly, alignment structures have been added to mounting brackets to aid in their alignment on a vertical rack structure. Mounting bracket 151 includes two pin-like alignment structures 153 attached to back plate 155. Each alignment structure 153 engages a hole of the vertical rail so as to align the bracket at positions corresponding to whole mounting unit increments.

It is sometimes desirable to have electronic devices sized at increments of ½ mounting unit increments to more efficiently utilize rack space. However, sizing equipment by ½ mounting unit increments requires that horizontal rack structures be mounted at positions corresponding to ½ mounting unit increments. The present inventor has determined that what is desirable is a mounting bracket that is alignable at positions on a vertical rack member corresponding to both whole mounting unit increments and at ½ mounting unit increments.

SUMMARY OF THE INVENTION

It has been discovered that providing a mounting bracket with alignment structures spaced apart at particular distances advantageously provides a mounting bracket that is readily alignable at positions corresponding to both whole mounting unit increments and ½ mounting unit increments.

In one aspect, the invention includes a mounting bracket for use with a rack having a rack structure defining a plurality of holes spaced along the rack structure to define mounting unit increments of the rack. The mounting bracket includes a mounting bracket body, a first alignment structure extending from the mounting bracket body, and a second alignment structure extending from the mounting bracket body. The first alignment structure and the second alignment structure each are adapted to engage a hole of the rack structure so as to align the bracket in a position along the rack structure. The first alignment structure and the second alignment structure are spaced apart such that the bracket is alignable along the rack structure both at positions corresponding to whole mounting unit increments and at positions corresponding to half mounting unit increments.

In another aspect of the invention, an electronics rack includes at least one vertical rack structure defining a plurality of mounting holes spaced along the vertical rack structure to define mounting unit increments of the rack. The electronics rack also includes a mounting bracket secured to a vertical rack structure of the at least one vertical rack structure. The mounting bracket includes a mounting bracket body, a first alignment structure extending from the mounting bracket body, and a second alignment structure extending from the mounting bracket body. The first alignment structure and the second alignment structure each are adapted to engage a mounting hole of the vertical rack structure so as to align the bracket in a position along the vertical rack structure. The first alignment structure and the second alignment structure are spaced apart such that the bracket is alignable along the vertical rack structure both at positions corresponding to whole mounting unit increments and at positions corresponding to half mounting unit increments.

In another aspect, the invention includes a mounting bracket for an electronics rack having a rack structure defining a plurality of holes spaced along the rack structure to define retma (U) mounting unit increments of the rack. The plurality of holes are spaced along the vertical rack structure in a pattern substantially conforming to an Electronics Industry Association (EIA) standard. The mounting bracket includes a mounting bracket body, a first alignment structure extending from the mounting bracket body, and a second alignment structure extending from the mounting bracket body. The first alignment structure and the second alignment structure each are adapted to engage a hole of the rack structure so as to align the bracket in a position along the rack structure. The first alignment structure and the second alignment structure being spaced apart such that the bracket is alignable along the rack structure both at positions corresponding to whole retma unit increments and at positions corresponding to half retma unit increments.

In another aspect, the invention includes a method for assembling an electronics rack assembly. The method includes determining a position to secure a mounting bracket to a vertical rail structure of an electronics rack. The vertical rack structure defines a plurality of holes spaced along the vertical rack structure to define mounting unit increments of the rack. The determined position to secure the mounting bracket being determined from positions corresponding to whole unit mounting increments and from positions corresponding to half unit mounting increments. The method also includes aligning the mounting bracket against the rail structure in the determined position. The mounting bracket includes a first and a second alignment structures each engaging a hole of the plurality of holes so as to align the bracket in the determined position. The first alignment structure and the second alignment structure are spaced apart such that the bracket is alignable along the rack structure both at the positions corresponding to whole mounting unit increments and at the positions corresponding to half mounting unit increments. The method further includes securing the bracket to the vertical rack structure at the determined position.

In another aspect, the invention includes a mounting bracket for a rack having defined mounting unit increments. The mounting bracket includes a mounting bracket body, and means for aligning the mounting bracket along a rack structure of the rack both at positions corresponding to whole mounting unit increments and at positions corresponding to half mounting unit increments.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

The following sets forth a detailed description of a mode for carrying out the invention. The description is intended to be illustrative of the invention and should not be taken to be limiting.

Figure 2:
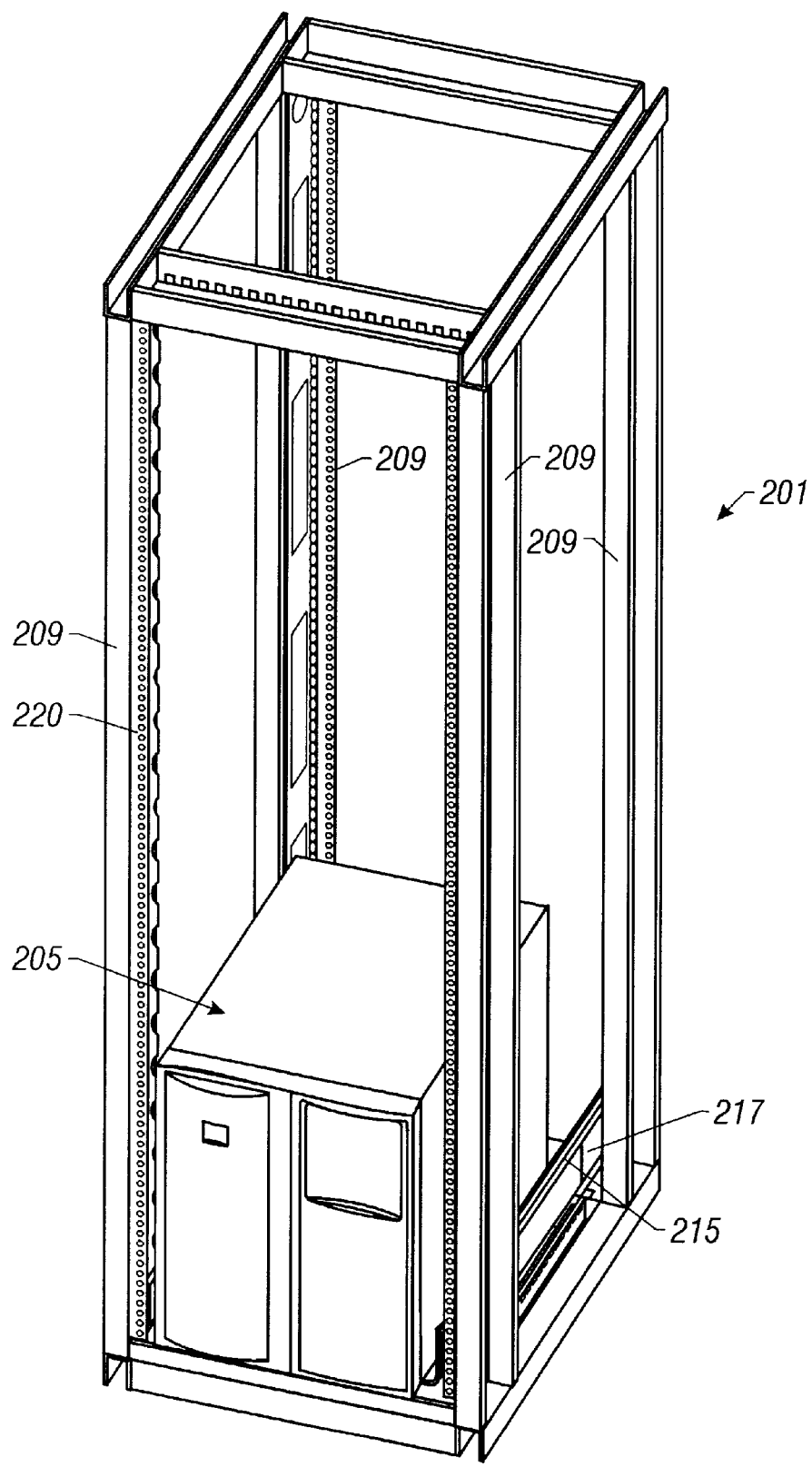
FIG. 2 is a perspective view of an electronics rack according to the present invention.

FIG. 2 shows a perspective view of an electronics rack and an electronic device mounted in the electronics rack. Electronics rack 201 houses electronic devices such as computer system server 205. An example of a server is the POWER EDGE 2300 sold by the DELL COMPUTER CORP. Other types of conventional electronic devices such as other types of computer systems, power supplies, radio equipment, radar equipment, instrumentation or measurement devices, lab equipment, communications equipment etc. may be mounted in rack 201. Another example of an electronic device that can be mounted in rack 201 includes the POWER VAULT 630F by the DELL COMPUTER CORP.

Figure 1:
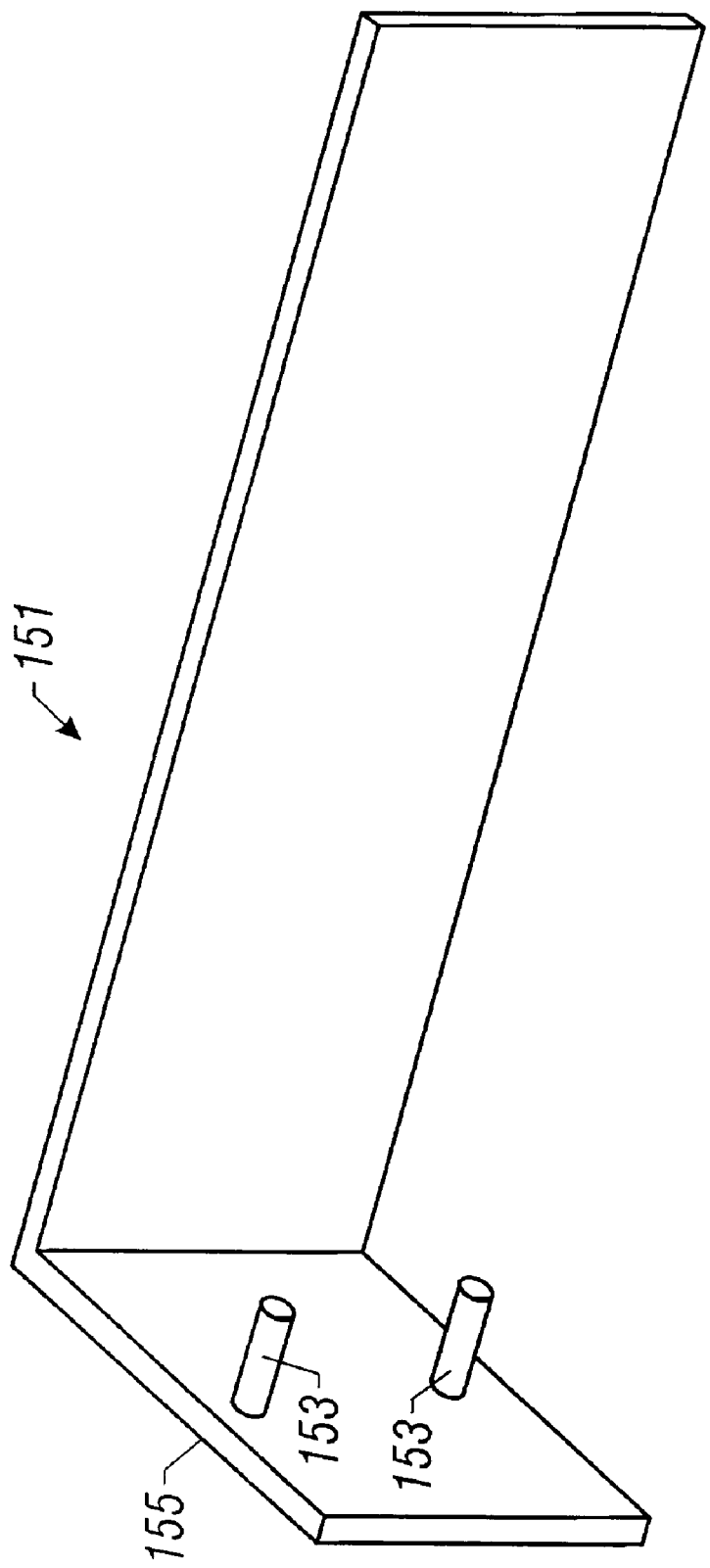
FIG. 1 is a perspective view of a prior art mounting bracket.

Electronics rack 201 includes four vertical rails 209. Each vertical rail has mounting holes 220 spaced along the rail for mounting electronic devices in the rack. The mounting hole spacings and rail spacings of electronics rack 201 conform to the Electronics Industry Association standard (EIA) RS-310, 19" rack. Sliding rail structures 215 are horizontal rail structures that allow for an electronic device to be slid into and out from rack 201 during maintenance, installation, or removal of the device. The sliding rail structures (with 215 shown) are coupled to the vertical rails 209 via mounting brackets (with 217 shown) that are secured to the vertical rails 209. The mounting brackets include alignment structures (not shown in FIG. 1) that are spaced apart and engage mounting holes 220 so as to align the bracket along vertical rails 209 in positions corresponding to both whole retma unit increments and half retma unit increments. For the RS-310 standard, a retma unit (U) is defined as 1.75 inches. Non sliding horizontal rail structures can also be use to mount electronic devices in rack 201.

Figure 3:
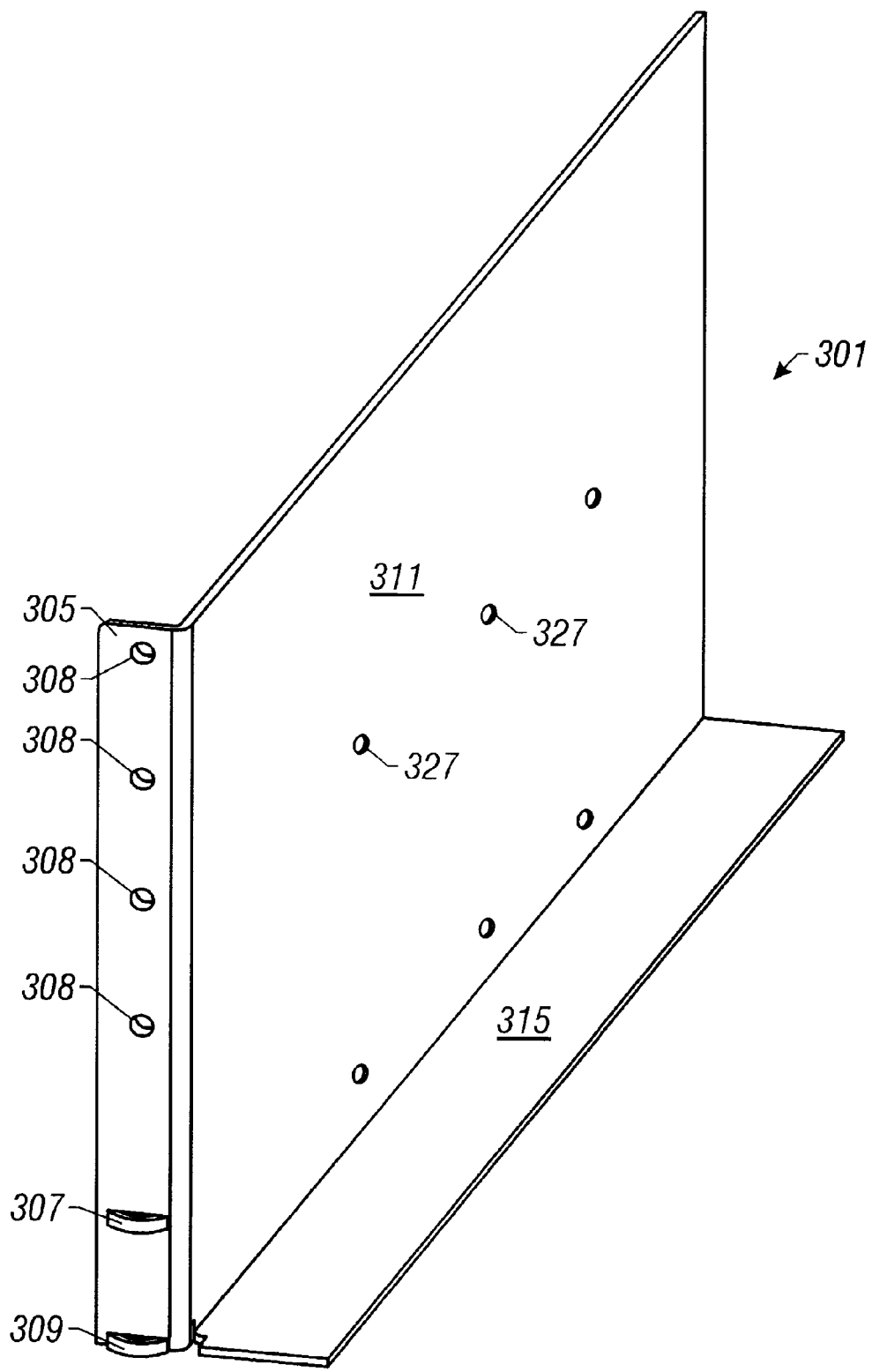
FIG. 3 is a perspective view of a mounting bracket according to the present invention.

FIG. 3 shows a perspective view of a mounting bracket according to the present invention. Mounting bracket 301 includes a back plate 305 that abuts a vertical rail such as rail 209 (see FIG. 2) when mounting bracket 301 is secured to the vertical rail (See FIG. 5). Extending from back plate 305 are alignment structures 307 and 309 that engage holes of the vertical rail to align mounting bracket 301 at positions on the rail corresponding to whole U increments and ½ U increments. Back plate 305 also includes holes 308 that receive bolts or other attaching mechanisms (such as a screw or rivet) to secure the mounting bracket to the vertical rail. Back plate 305 is bent at a 90 degree angle from a side vertical plate 311. Side vertical plate 311 is also bent at a 90 degree angle from bottom plate 315. Bottom horizontal plate 315 provides support for a horizontal rail structure (such as sliding rails) and/or an electronic device. Mounting bracket 301 includes bolt holes 327 for securing a horizontal rail structure or an electronic device housing structure to the mounting bracket 301.

Mounting bracket 301 is formed from a sheet of cold rolled steel having a thickness of 0.060 inches. However, mounting brackets according to the present invention may be made out of other material or materials such as other types of steel and may have other thicknesses. Alignment structures 307 and 309 are formed by shearing back plate 305 when pressing the structures outward from the back plane. Bottom plate 315 and back plate 305 are formed by bending the sheet by approximately 90 degrees.

Figure 4:
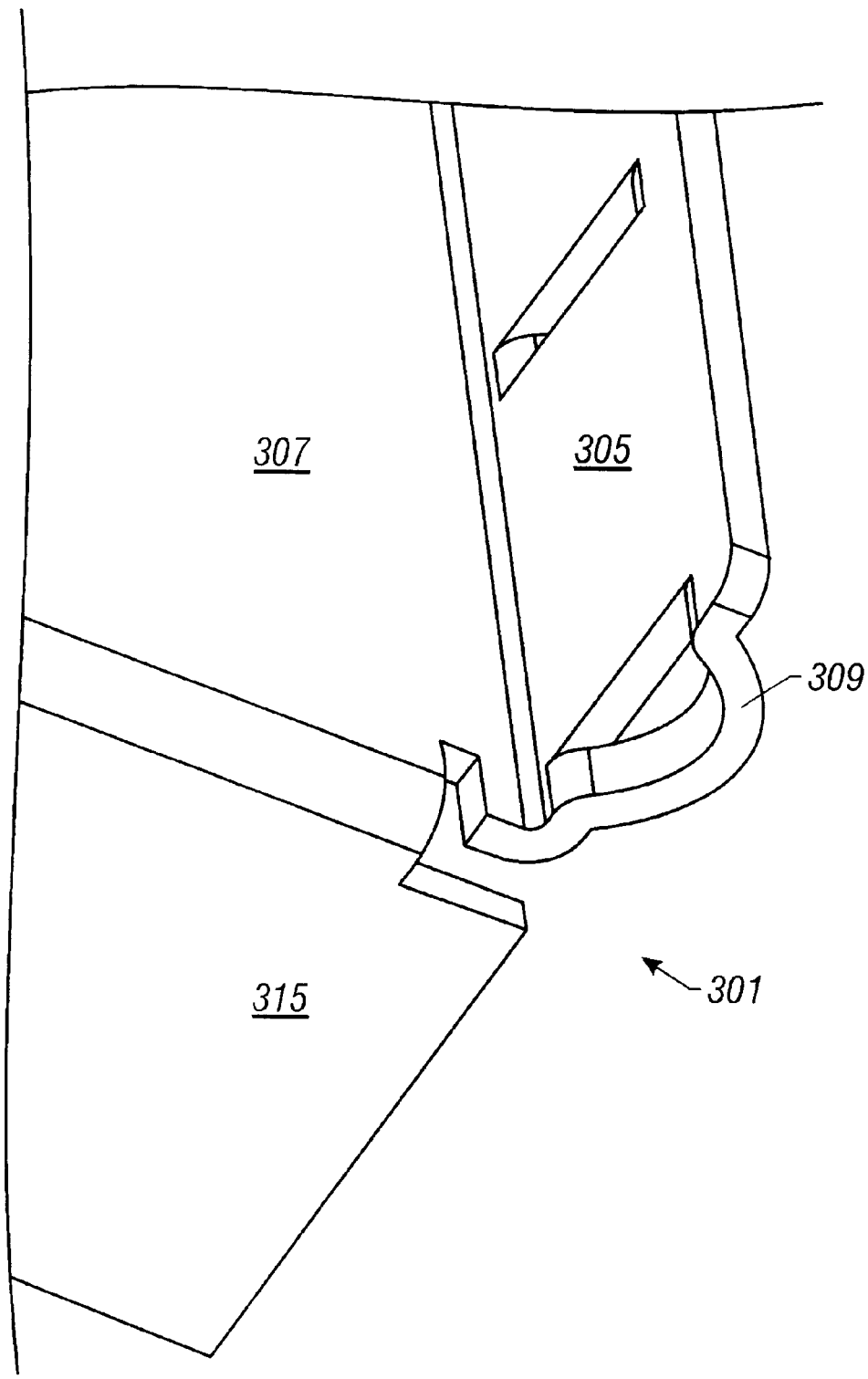
FIG. 4 is a partial perspective view of the mounting bracket of FIG. 3.

FIG. 4 shows a partial perspective view of mounting bracket 301.

Figure 5:
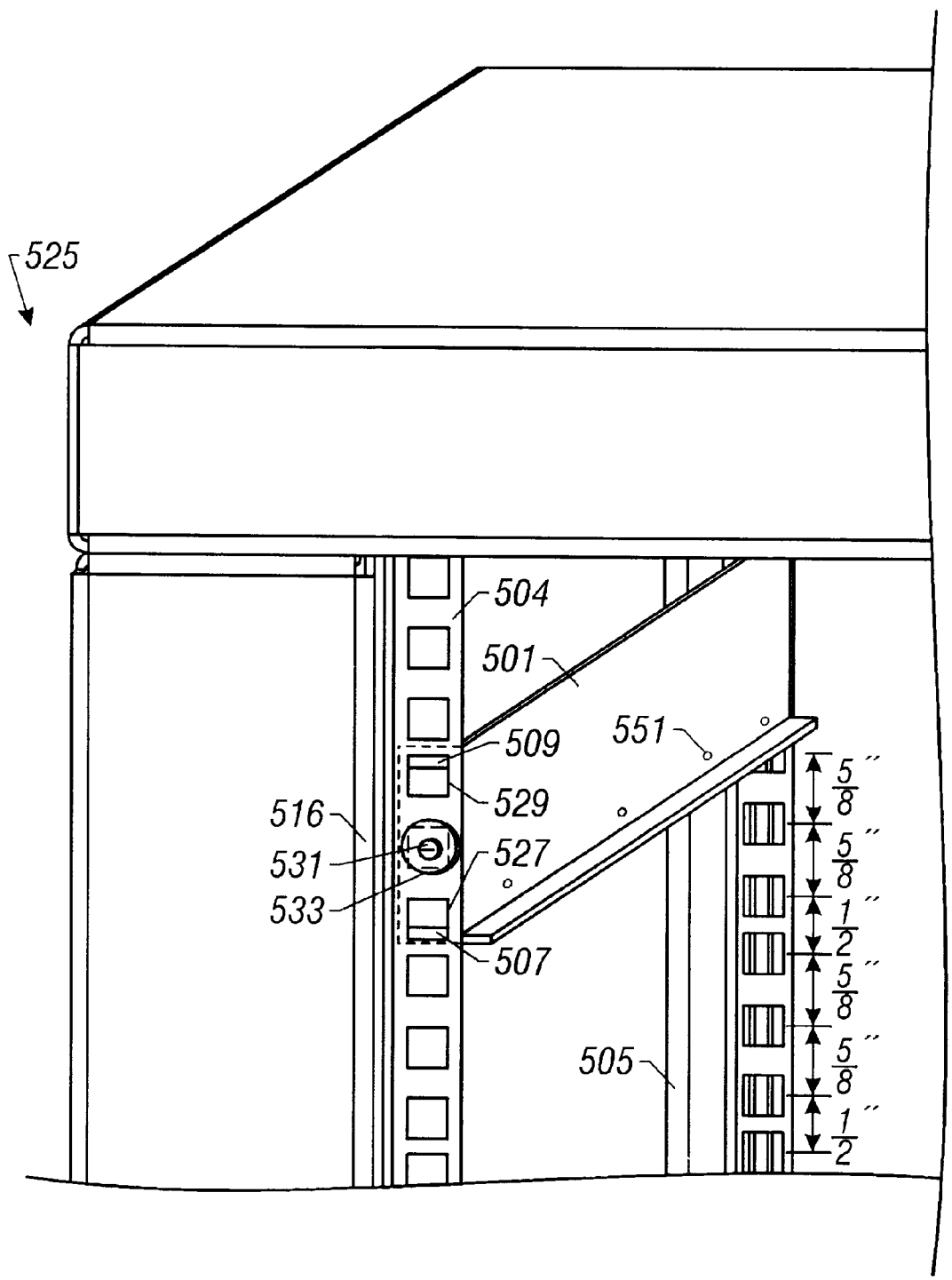
FIG. 5 is a partial perspective view of a mounting bracket secured in an electronics rack according to the present invention.

FIG. 5 shows a partial perspective view of a mounting bracket secured to a conventional vertical rack structure as described above at a position on the vertical rack structure corresponding to a whole mounting unit increment. The mounting hole spacings and vertical rail spacings of electronics rack 525 conform to the RS-310 EIA standard. The mounting holes of vertical rails 504 and 505 have a rectangular form and are spaced apart at a repeating, irregular pattern of ½" to ⅝" to ⅝" (center line to center line). The rectangular mounting holes have a height of 9.5 mm and a width of 9.5 mm.

When mounting bracket 501 is secured to vertical rail 504, the back plate (shown in phantom) of mounting rail 501 abuts the back side of rail 504 (relative to the view shown in FIG. 5). Mounting bracket 501 is secured to rail 504 by a bolt 531 extending through a hole in washer 533, though a hole 516 (shown in phantom) in rail 504, through a hole in the back plate, and into a self clenching nut (not shown) that was previously pressed into the hole of the back plate. An example of a self clenching nut is a M5 PEM #SS-M5-2-Z1 sold by the PEM CORP.

Mounting bracket 501 includes two alignment structures 507 and 509 that are of a similar construction to alignment structures 307 and 309 of FIG. 3. When mounting bracket 501 is secured to rail 504 in the position shown in FIG. 5, alignment structure 509 engages hole 529 and alignment structure 507 engages hole 527. In FIG. 5, alignment structure 509 engages hole 529 by extending into hole 529 and residing next to the top interior side of hole 529. Alignment structure 507 engages hole 527 by extending into hole 527 and residing next to the bottom interior side of hole 527. One difference between the mounting bracket of FIG. 5 and the mounting bracket of FIG. 3 is that alignment structures 507 and 509 are located on opposite sides of the mounting holes (not shown) of bracket 501 whereas the alignment structures 307 and 309 are located on the same side of mounting holes 308 (See FIG. 3).

When engaged with the mounting holes 527 and 529 of rail 504, alignment structures 507 and 509 prevent mounting bracket 501 from rotating with respect to rail 504 around the bolt 531 engaged with the self clenching nut.

In FIG. 5, mounting bracket 501 extends from rail 504 to rail 505 where it is secured to rail 505 with a bolt and self clenching nut (neither shown) through a hole (not shown) in rail 505. The end of mounting bracket 501 that is secured to rail 505 may also include alignment structures (not shown) similar to alignment structures 507 and 509. Mounting bracket 501 also includes holes 551 for securing a sliding rail structure (not shown) or electronic device housing to mounting bracket 501. A sliding rail structure would allow for an electronic device to be slid into and out from rack 525.

To install mounting bracket 501 in rack 525, the back plate of bracket 501 is placed against the back of rail 504, relative to the view shown in FIG. 5, in a general location of the desired mounting position. The back plate of bracket 501 can be slightly moved laterally and/or vertically against the back side of rail 504 to finely align bracket 501 in the desired mounting position where alignment structures 507 and 509 each extend into a mounting hole of rail 504. An installer, holding bracket 501 against rail 504 with one hand, extends and/or screws bolt 531 (with washer 533) through mounting hole 516 in rail 504, through a hole in the back plate of bracket 501, and into the self clenching nut with the other hand to secure bracket 501 to rail 504. Alignment structures 507 and 509 extending into mounting holes of vertical rail 504 advantageously prevent the lateral, vertical, and/or rotational movement of bracket 501 from the desired mounting position, thereby allowing the installer to secure the bracket to the rail without having to hold the bracket so as to prevent lateral, vertical, or rotational movement of the bracket.

After the other end of bracket 501 is secured to rail 505, a sliding rail structure (not shown) is secured to mounting bracket 501. Following a second mounting bracket (not shown) and sliding rail structure (not shown) being installed on the opposing vertical rails (not shown) of rack 525, an electronic device is secured to the sliding rail structures to mount the device in rack 525. An electronic device may be mounted in rack 505 by securing the device housing to the mounting brackets (with 501 shown).

Figure 6:
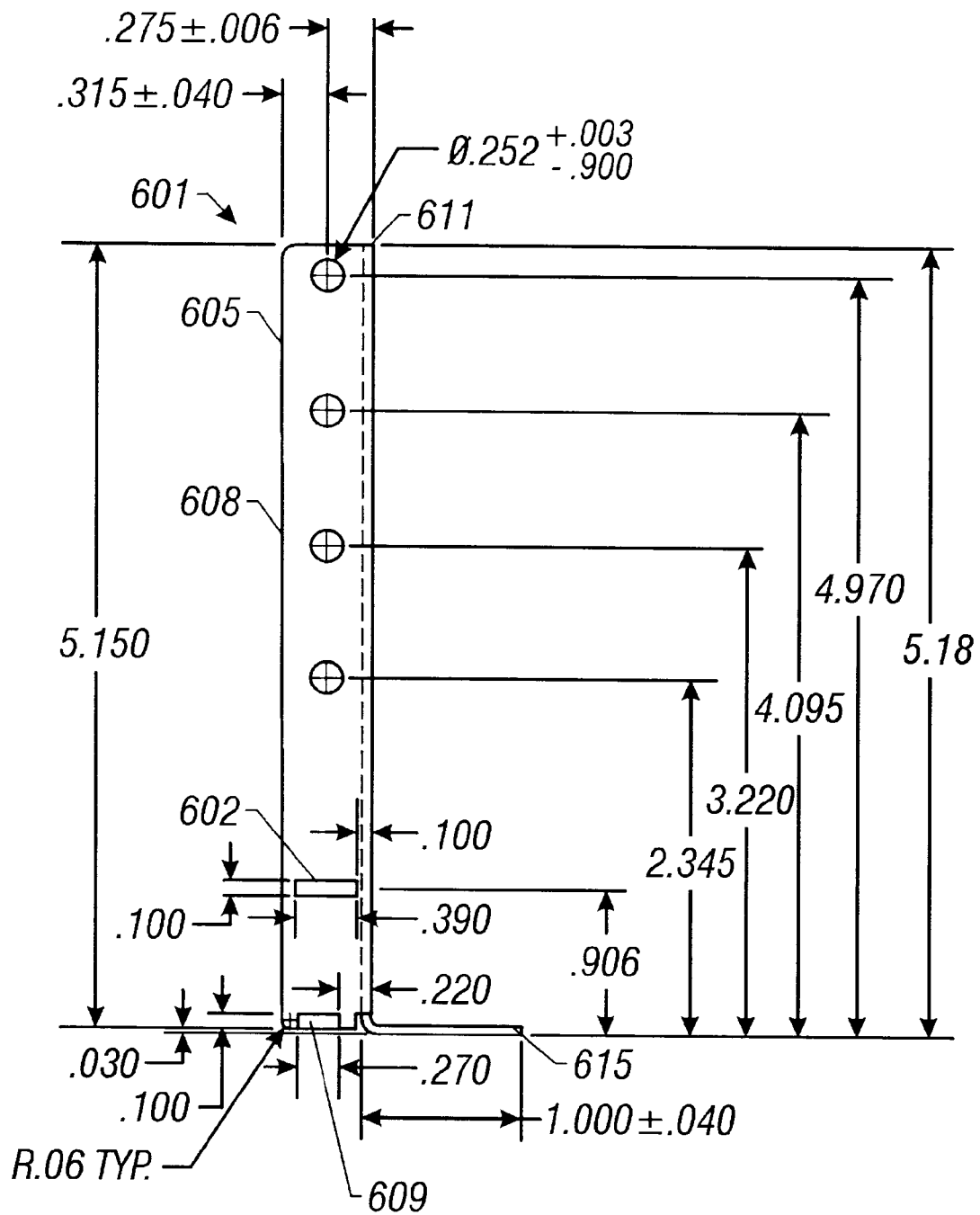
FIG. 6 is a side view of a mounting bracket including dimensions according to the present invention.

FIG. 6 shows a side view of a mounting bracket with dimensions according to the present invention. The dimensions shown are given in inches. Mounting bracket 601 includes two alignment structures extending out from plate 605. Plate 605 also includes mounting holes 608. Bracket 601 also includes a bottom plate 615. Shown in phantom is a side vertical plate 611 extending into the page of FIG. 6.

In one embodiment, side vertical plate 611 and bottom plate 615 extend back approximately 28 inches.

Figure 7:
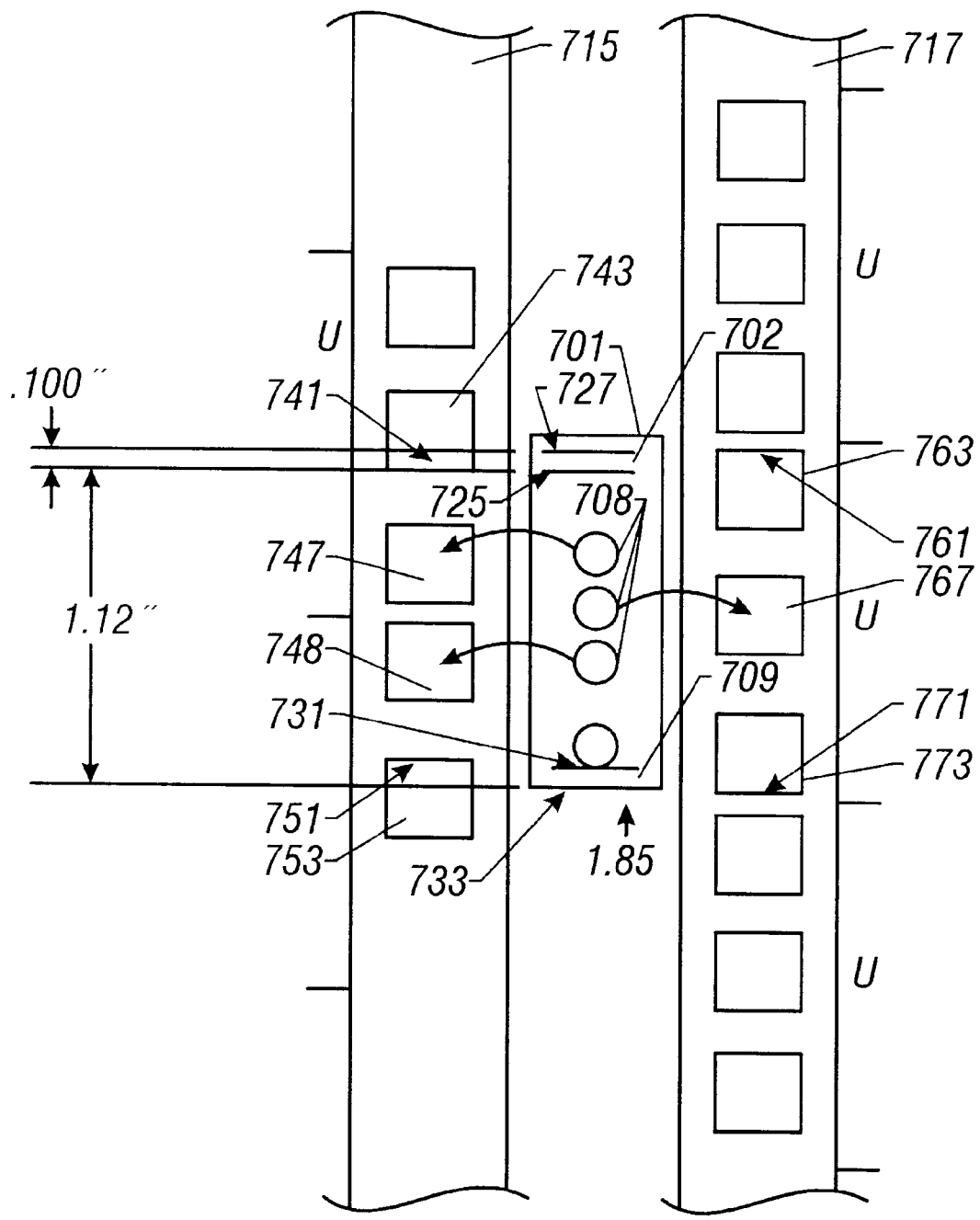
FIG. 7 is a side view of a mounting bracket illustrating the position of the alignment structures with respect to vertical rack structures in positions corresponding to whole mounting unit increments and half mounting unit increments.

FIG. 7 shows a side view of a mounting bracket positioned next to vertical rack structures to illustrate the position of the mounting bracket with respect to a vertical rack structure when aligned with positions corresponding to whole mounting unit increments and positions corresponding to ½ mounting unit increments according to the present invention. Rails 715 and 717 are vertical rails of an electronics rack. Rails 715 and 717 include mounting holes spaced at a repeating, irregular pattern of ½" to ⅝" to ⅝" (center line to center line) according to the EIA RS-310 19" rack standard. Rails 715 and 717 are shown to illustrate the alignment of mounting 701 bracket with a vertical rail at a position corresponding to a whole U increment (rail 717) and a position corresponding to a ½ U increment (rail 715). It is understood that when mounting bracket 701 is secured to either rail 715 or 717, mounting bracket 701 is positioned to abut the backside of either rail 715 or 717, relative to the view shown in FIG. 7. Bracket 701 includes two alignment structures 707 and 709 positioned on opposite sides of mounting holes 708.

When mounting bracket 701 is secured to rail 715 in the position shown corresponding to a ½ U increment, the bottom edge 725 of alignment structure 707 resides next to the bottom interior side 741 of rail hole 743 and the top edge 731 of alignment structure 709 resides next to top interior side 751 of rail hole 753. Also, when mounting bracket 701 is secured to rail 715 in the position shown, bolts extend through the top and bottom mounting holes (of mounting holes 708) and through rail holes 747 and 748 to secure bracket 701 to rail 715.

When mounting bracket 701 is secured to rail 717 in the position shown corresponding to a whole U increment, the top edge 727 of alignment structure 707 resides next to the top interior side 761 of rail hole 763 and the bottom edge 733 of alignment structure 709 resides next to bottom interior side 771 of rail hole 773. Also, when mounting bracket 701 is secured to rail 717 in the position shown, a bolt extends through the middle mounting hole (of mounting holes 708) and through rail hole 767 to secure bracket 701 to rail 717.

Figure 8:
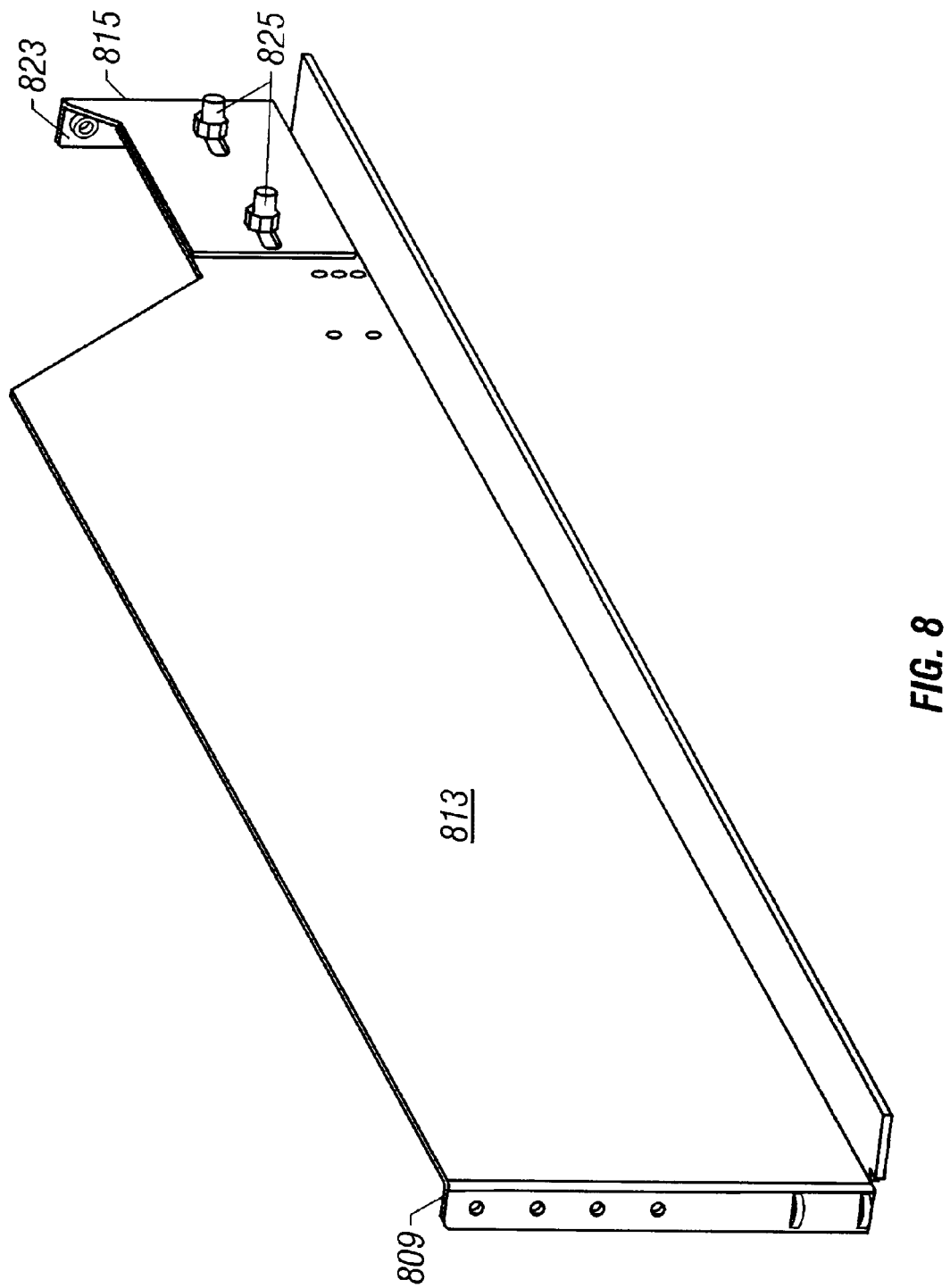
FIG. 8 is a perspective view of a mounting bracket according to the present invention.

FIG. 8 shows a perspective view of a mounting bracket according to the present invention. Coupled to side vertical plate 813 is an adjustable bracket end 815 which is adjustable with respect to vertical plate 813 to accommodate for variations in depth of different electronics racks. To install mounting bracket 801 in a rack, back plate 809 is aligned and secured to a vertical rail of the rack as previously described. Adjusting bolts 825 would be unscrewed such that bracket end 815 is allowed to be moved outward to where plate 823 abuts a second vertical rail of the rack. After plate 823 is secured to the second vertical rail, adjusting bolts 825 are tightened.

Based upon the teachings herein, those of skill in the art will recognize that the alignment structure feature shown and described herein may be implemented on other types or forms of mounting brackets other than those shown or described herein. For example, referring back to FIG. 5, if bracket 501 is designed to be secured on the outside of rail 504, then alignment structures 507 and 509 would extend inward from the back plate of the mounting bracket 501 (Similar to alignment structures 153 of FIG. 1) where the back plate would abut against the front side of rail 504 when secured to rail 504, relative to the view shown in FIG. 5. A mounting bracket may be an integral part of portions of a horizontal sliding rail structure. Also, a mounting bracket may be an integral part of an electronic device housing such as, for example, a side panel, bottom panel, and/or back panel. Also portions of the mounting bracket may be formed separately (such as back panel 305 and side vertical panel 311 of FIG. 3) and attached afterwards.

Figure 9:
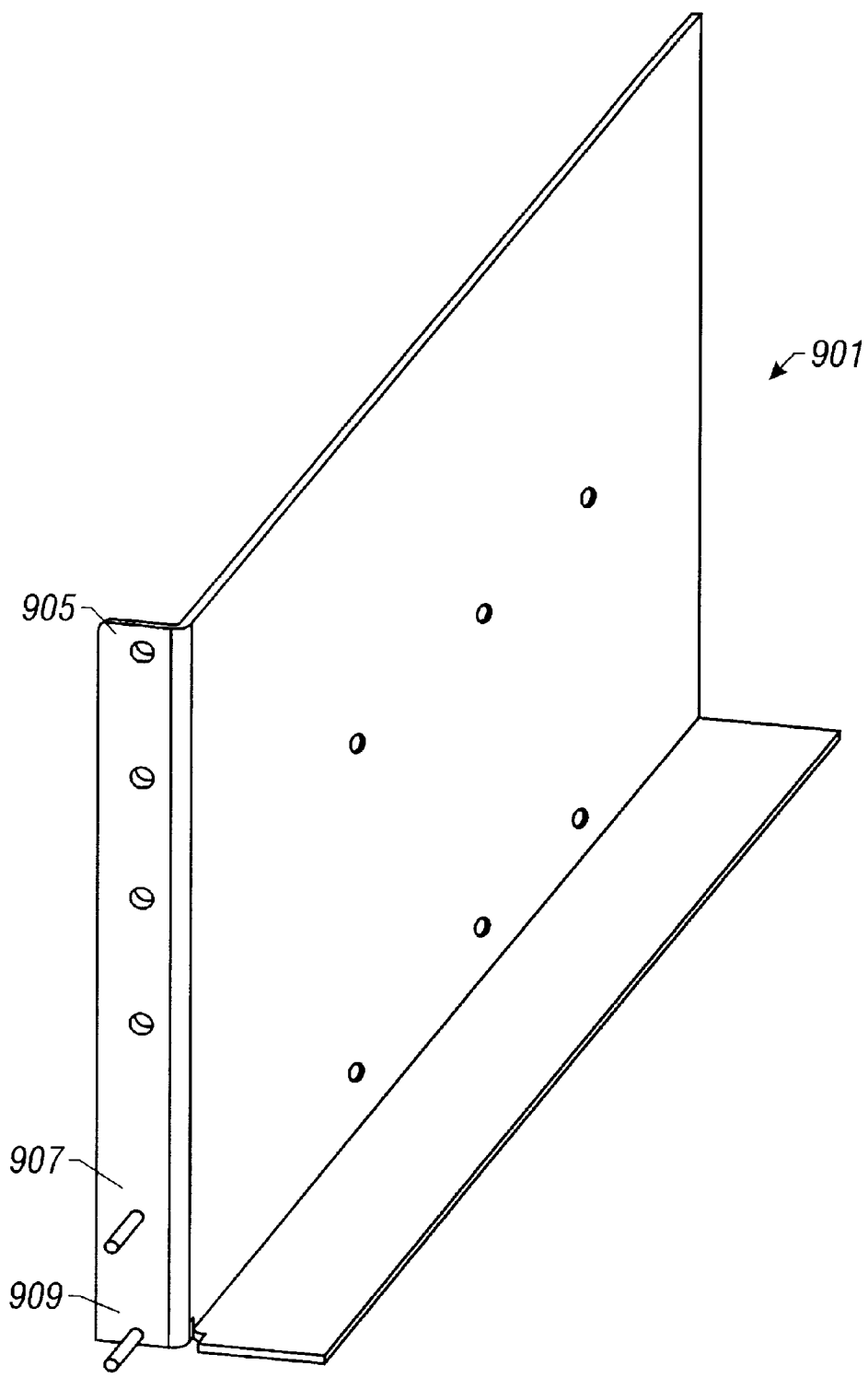
FIG. 9 is a perspective view of a mounting bracket according to the present invention.

Also, based upon the teachings herein, those of skill in the art will recognize that other types of alignment structures other than those shown or described herein may be utilized. For example, the alignment structure may have the form of a circular detent or of a rectangular detent. Also, the alignment structure may be pressed outward from a plate without making cuts in the plate as opposed to alignment structures 307 and 309 of FIG. 3. Also, the plate may be cut on 3 sides as opposed to two sides as with alignment structures 307 and 309 of FIG. 3. Also, the alignment structures may be separately formed from the mounting bracket and attached to extend outward (or inward) from the mounting bracket. Examples of separately formed alignment structures includes rectangular tabs or circular (or rectangular) bolt or pin-like structures that are welded or pressed into the bracket structure. FIG. 9 shows a perspective view of mounting bracket 901 having two alignment pin-like structures that are separately formed and welded to backplate 905. Also, the alignment structures could be tab structures that initially extend out well past the rail mounting holes and are bent against the opposite side of the rail to secure the bracket to the rail. The form of the alignment structures may be dependent at least in part on the form of the mounting holes of the vertical rack structures.

Figure 7A:
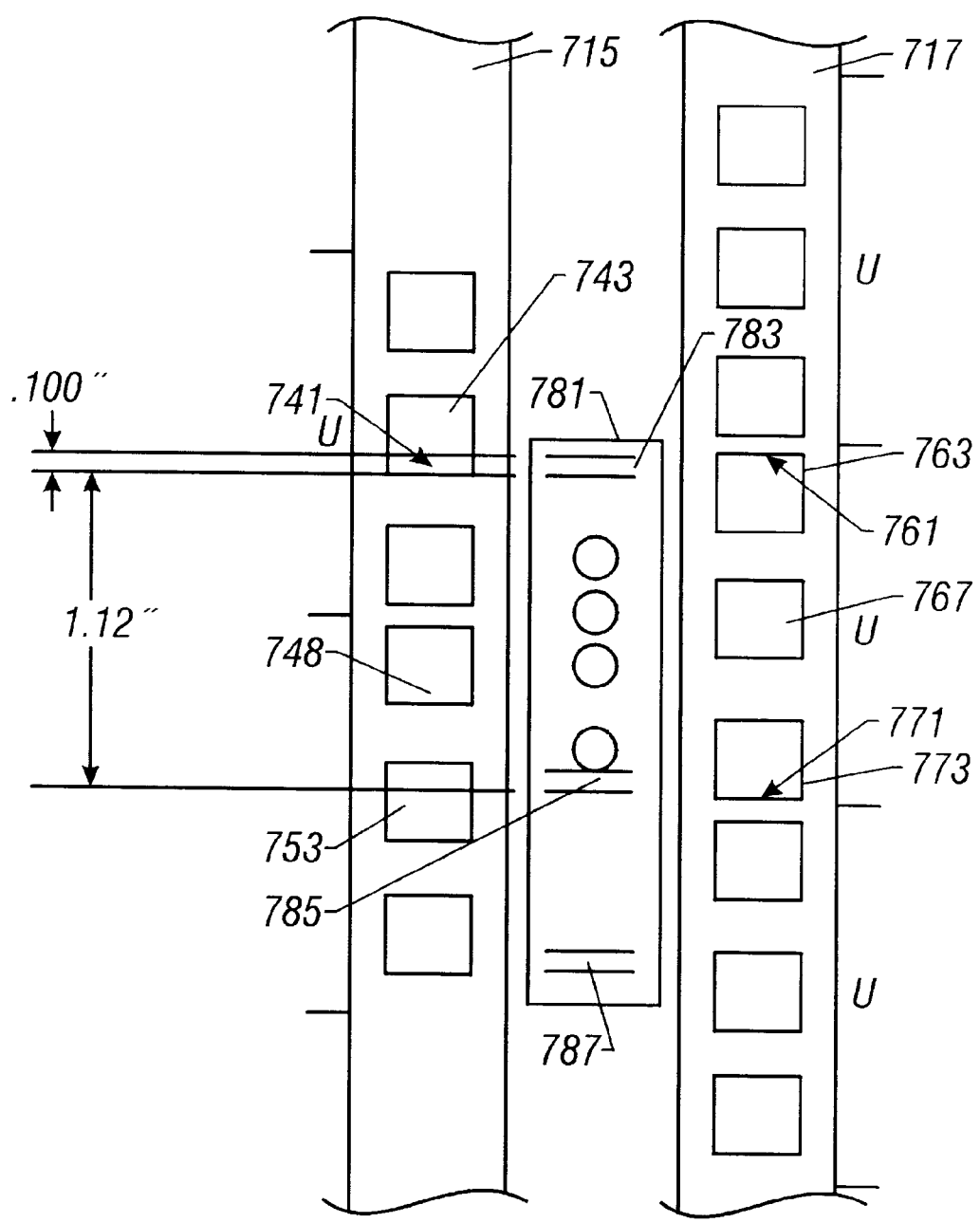
FIG. 7A is a side view of a mounting bracket illustrating the position of the alignment structures with respect to vertical rack structures in positions corresponding to whole mounting unit increments and half mounting unit increments.

In other embodiments of the present invention, a mounting bracket may include more than two alignment structures that engage holes of a rack structure to align the mounting bracket and spaced apart such that the bracket is aligned at positions corresponding to both whole mounting unit increments and half mounting unit increments. FIG. 7A shows a side view of a mounting bracket 781 illustrating the position of alignment structures 783, 785, and 787 with respect to vertical rails 717 and 715 in positions corresponding to whole mounting unit increments and half mounting unit increments, respectively.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention.

What is claimed is:

1. A mounting bracket for use with a rack having a rack structure defining a plurality of holes spaced along the rack structure to define mounting unit increments of the rack, the mounting bracket comprising:

a mounting bracket body;

a first alignment structure extending from the mounting bracket body; and a second alignment structure extending from the mounting bracket body, the first alignment structure and the second alignment structure each are adapted to engage a hole of the rack structure so as to align the bracket in a position along the rack structure, the first alignment structure and the second alignment structure being spaced apart such that the bracket is alignable along the rack structure both at positions corresponding to whole mounting unit increments and at positions corresponding to half mounting unit increments;

wherein the first alignment structure has a first edge and a second edge, and when the bracket is aligned in positions corresponding to whole mounting unit increments of the rack, the first edge of the first alignment structure is positioned next to a side of a hole of the rack structure, when the bracket is aligned in positions corresponding to half mounting unit increments of the rack, the second edge of the first alignment structure is positioned next to a side of a hole of the rack; and wherein the second alignment structure has a first edge and a second edge, and when the bracket is aligned in positions corresponding to half mounting unit increments of the rack, the first edge of the second alignment structure positioned next to a side of a hole of the rack structure, when the bracket is aligned in positions corresponding to half mounting unit increments of the rack, the second edge of the second alignment structure is positioned next to a side of a hole of the rack.

2. A mounting bracket for use with a rack having a rack structure defining a plurality of holes spaced along the rack structure to define mounting unit increments of the rack, the mounting bracket comprising:

a mounting bracket body;

a first alignment structure extending from the mounting bracket body; and a second alignment structure extending from the mounting bracket body, the first alignment structure and the second alignment structure each are adapted to engage a hole of the rack structure so as to align the bracket in a position along the rack structure, the first alignment structure and the second alignment structure being spaced apart such that the bracket is alignable along the rack structure both at positions corresponding to whole mounting unit increments and at positions corresponding to half mounting unit increments;

wherein the plurality of holes are spaced along the rack structure in a pattern substantially conforming to an Electronics Industry Association (EIA) standard.

3. The mounting bracket of claim 1 wherein the plurality of holes are spaced along the rack structure in an irregular repeating pattern.

4. The mounting bracket of claim 1 wherein the mounting bracket body includes:

a plate, the first and second alignment structures extending from the plate.

5. A mounting bracket for use with a rack having a rack structure defining a plurality of holes spaced along the rack structure to define mounting unit increments of the rack, the mounting bracket comprising:

a mounting bracket body;

a first alignment structure extending from the mounting bracket body; and a second alignment structure extending from the mounting bracket body, the first alignment structure and the second alignment structure each are adapted to engage a hole of the rack structure so as to align the bracket in a position along the rack structure, the first alignment structure and the second alignment structure being spaced apart such that the bracket is alignable along the rack structure both at positions corresponding to whole mounting unit increments and at positions corresponding to half mounting unit increments;

wherein the mounting bracket body includes a plate, the first and second alignment structures extend from the plate;

wherein the first and second alignment structures are pressed out from the plate.

6. The mounting bracket of claim 5 wherein the first and second alignment structures each have first and second sides sheared from the plate.

7. The mounting bracket of claim 4 wherein the plate abuts against the rack structure when the first and second alignment structures each engage a hole of the rack structure.

8. The mounting bracket of claim 4 wherein the alignment structures are non-integral to the plate.

9. The mounting bracket of claim 1 wherein:
the first alignment structure has a first edge and a second edge, the first edge of the first alignment structure is spaced approximately 0.1 inches from the second edge;
the second alignment structure has a first edge and a second edge, the first edge of the second alignment structure is spaced approximately 0.1 inches from the second edge of the second alignment structure.

10. A mounting bracket for use with a rack having a rack structure defining a plurality of holes spaced along the rack structure to define mounting unit increments of the rack, the mounting bracket comprising:
a mounting bracket body;
a first alignment structure extending from the mounting bracket body; and
a second alignment structure extending from the mounting bracket body, the first alignment structure and the second alignment structure each are adapted to engage a hole of the rack structure so as to align the bracket in a position along the rack structure, the first alignment structure and the second alignment structure being spaced apart such that the bracket is alignable along the rack structure both at positions corresponding to whole mounting unit increments and at positions corresponding to half mounting unit increments;
wherein the first alignment structure has a first edge and a second edge, the first edge of the first alignment structure is spaced approximately 0.1 inches from the second edge;
wherein the second alignment structure has a first edge and a second edge, the first edge of the second alignment structure is spaced approximately 0.1 inches from the second edge of the second alignment structure;
wherein the first edge of the of the first alignment structure is spaced approximately 0.876 inches from the first edge of the second alignment structure and the second edge of the first alignment structure is spaced approximately 0.876 inches from the second edge of the second alignment structure.

11. The mounting bracket of claim 9 wherein the first edge of the of the first alignment structure is spaced approximately 1.12 inches from the first edge of the second alignment structure and the second edge of the first alignment structure is spaced approximately 1.12 inches from the second edge of the second alignment structure.

12. The mounting bracket of claim 1 wherein
the first edge of the first alignment device is spaced apart along a first dimension from the second edge of the first alignment device by a first distance; and
each hole of the plurality of holes having a length along a dimension which is generally parallel to the first dimension when the mounting bracket is aligned in a position along the rail structure, and the length of each hole along the dimension is at least twice the first distance.

13. The mounting bracket of claim 1 wherein a mounting unit is defined as 1.75 inches.

14. A mounting bracket for use with a rack having a rack structure defining a plurality of holes spaced along the rack structure to define mounting unit increments of the rack, the mounting bracket comprising:
a mounting bracket body;
a first alignment structure extending from the mounting bracket body; and
a second alignment structure extending from the mounting bracket body, the first alignment structure and the second alignment structure each are adapted to engage a hole of the rack structure so as to align the bracket in a position along the rack structure, the first alignment structure and the second alignment structure being spaced apart such that the bracket is alignable along the rack structure both at positions corresponding to whole mounting unit increments and at positions corresponding to half mounting unit increments; and
a horizontal rail portion fixably secured to the mounting bracket body with at least one attachment device.

15. The mounting bracket of claim 1 wherein the holes of the rack structure that receive the alignment structures have a rectangular shape.

16. The mounting bracket of claim 1 further comprising:
a third alignment structure extending from the mounting bracket body, wherein the first alignment structure, the second alignment structure, and the third alignment structure each are adapted to engage a hole of the rack structure so as to align the bracket in a position along the rack structure, the first alignment structure, the second alignment structure, and the third alignment structure being spaced apart such that the bracket is alignable along the rack structure both at positions corresponding to whole mounting unit increments and at positions corresponding to half mounting unit increments.

17. The mounting bracket of claim 1 wherein the first alignment structure, the second alignment structure, and the mounting bracket body are integral to one another.

18. A mounting bracket for use with a rack having a rack structure defining a plurality of holes spaced along the rack structure to define mounting unit increments of the rack, the mounting bracket comprising:
a mounting bracket body;
a first alignment structure extending from the mounting bracket body; and
a second alignment structure extending from the mounting bracket body, the first alignment structure and the second alignment structure each are adapted to engage a hole of the rack structure so as to align the bracket in a position along the rack structure, the first alignment structure and the second alignment structure being spaced apart such that the bracket is alignable along the rack structure both at positions corresponding to whole mounting unit increments and at positions corresponding to half mounting unit increments;
wherein the mounting body defines at least one hole for receiving an attachment mechanism for securing the mounting bracket to the rack structure.

19. A mounting bracket for use with a rack having a rack structure defining a plurality of holes spaced along the rack structure to define mounting unit increments of the rack, the mounting bracket comprising:
a mounting bracket body;

a first alignment structure extending from the mounting bracket body; and a second alignment structure extending from the mounting bracket body, the first alignment structure and the second alignment structure each are adapted to engage a hole of the rack structure so as to align the bracket in a position along the rack structure, the first alignment structure and the second alignment structure being spaced apart such that the bracket is alignable along the rack structure both at positions corresponding to whole mounting unit increments and at positions corresponding to half mounting unit increments;

wherein the mounting body further includes a rail structure having a first end and a second end, the first and second alignment structures being located at the first end, the second end extending towards a second rack structure positioned generally parallel to the rack structure.

20. A mounting bracket for use with a rack having a rack structure defining a plurality of holes spaced along the rack structure to define mounting unit increments of the rack, the mounting bracket comprising:

a mounting bracket body;

a first alignment structure extending from the mounting bracket body; and a second alignment structure extending from the mounting bracket body, the first alignment structure and the second alignment structure each are adapted to engage a hole of the rack structure so as to align the bracket in a position along the rack structure, the first alignment structure and the second alignment structure being spaced apart such that the bracket is alignable along the rack structure both at positions corresponding to whole mounting unit increments and at positions corresponding to half mounting unit increments;

wherein the mounting bracket body defines a first set of at least one hole for receiving an attachment mechanism to secure the mounting bracket to the vertical rack structure at positions corresponding to whole mounting unit increments;

wherein the mounting bracket body defines a second set of at least one hole for receiving an attachment mechanism to secure the mounting bracket to the vertical rack structure at positions corresponding to half mounting unit increments.

21. An electronics rack comprising:

at least one vertical rack structure defining a plurality of mounting holes spaced along the vertical rack structure to define mounting unit increments of the rack;

a mounting bracket secured to a vertical rack structure of the at least one vertical rack structure, the mounting bracket including:

a mounting bracket body;

a first alignment structure extending from the mounting bracket body; and a second alignment structure extending from the mounting bracket body, the first alignment structure and the second alignment structure each are adapted to engage a mounting hole of the vertical rack structure so as to align the bracket in a position along the vertical rack structure, the first alignment structure and the second alignment structure being spaced apart such that the bracket is alignable along the vertical rack structure both at positions corresponding to whole mounting unit increments and at positions corresponding to half mounting unit increments.

22. The electronics rack of claim 21 wherein the plurality of mounting holes are spaced along the vertical rack structure in a pattern substantially conforming to an Electronics Industry Association (EIA) standard.

23. The electronics rack of claim 22 wherein the plurality of mounting holes are spaced along the vertical rack structure in a pattern substantially conforming to an EIA RS-310 standard.

24. The electronics rack of claim 21 wherein the mounting bracket body further includes:

a horizontal rail extending from the vertical rack structure towards a second vertical rack structure, the horizontal rail being adapted to support an electronic device mounted in the rack.

25. The electronics rack of claim 21 wherein the horizontal rail includes a first end and a second end, the first alignment structure and the second alignments structure being located at the first end, the second end secured to the second vertical rail structure, the second end being adjustable with respect to the first end.

26. The electronics rack of claim 21 wherein the mounting bracket body further includes:

a first portion, the first and second alignment structures extending from the first portion, wherein the horizontal rail and the first portion are non-integral.

27. The electronics rack of claim 21 wherein each mounting hole of the plurality of mounting holes has a rectangular form.

28. The electronics rack of claim 21 wherein the plurality of mounting holes are spaced along the vertical rack structure in an irregular repeating pattern.

29. The electronics rack of claim 28 where the plurality of mounting holes are spaced along the vertical rack structure in an irregular repeating pattern of ½ inch, ⅝ inch, ⅝ inch centerline to centerline.

30. The electronics rack of claim 21 wherein the vertical rack structure includes a vertical rail.

31. The electronics rack of claim 21 wherein a mounting unit is defined as approximately 1.75 inches.

32. The electronics rack of claim 21 further comprising:

a self clenching nut;

an attachment mechanism;

wherein the mounting bracket body further defines a hole;

wherein the attachment mechanism is engaged with the self clenching nut and the hole to secure the mounting bracket to the vertical rack structure.

33. A computer system assembly of claim 21 comprising an electronics rack according to claim 20 and further comprising:

a computer system;

the computer system supported in the rack by at least one structure secured to the vertical rack structure via the mounting bracket.

34. The computer system assembly of claim 33 wherein:

the first alignment structure has a first edge and a second edge, the first edge of the first alignment structure is approximately 0.1 inches from the second edge;

the second alignment structure has a first edge and a second edge, the first edge of the second alignment structure is approximately 0.1 inches from the second edge of the second alignment structure.

35. The computer system assembly of claim 33 wherein the plurality of mounting holes are spaced along the vertical rack structure in an irregular repeating pattern.

36. The computer system assembly of claim 33 wherein the plurality of mounting holes are spaced along the vertical rack structure in a pattern substantially conforming to an Electronics Industry Association (EIA) standard.

37. The computer system assembly of claim 36 wherein the plurality of mounting holes are spaced along the vertical rack structure in a pattern substantially conforming to an EIA RS-310 standard.

38. The computer system assembly of claim 33 wherein the mounting body includes:
   a plate, the first and second alignment structures extending from the plate.

39. The computer system assembly of claim 33 wherein the computer system includes a computer server.

40. A mounting bracket for an electronics rack having a rack structure defining a plurality of holes spaced along the rack structure to define retma (U) mounting unit increments of the rack, wherein the plurality of holes are spaced along the vertical rack structure in a pattern substantially conforming to an Electronics Industry Association (EIA) standard, the mounting bracket comprising:
   a mounting bracket body;
   a first alignment structure extending from the mounting bracket body;
   a second alignment structure extending from the mounting bracket body, the first alignment structure and the second alignment structure each are adapted to engage a hole of the rack structure so as to align the bracket in a position along the rack structure, the first alignment structure and the second alignment structure being spaced apart such that the bracket is alignable along the rack structure both at positions corresponding to whole retma unit increments and at positions corresponding to half retma unit increments.

41. The mounting bracket of claim 40 wherein the mounting bracket body defines at least one hole for receiving an attachment device for mounting a horizontal rail to the mounting bracket body to mount the horizontal rail in the rack.

42. The mounting bracket of claim 40 wherein:
   the mounting bracket body defines a first set of at least one hole for receiving an attachment mechanism to secure the mounting bracket to the vertical rack structure at positions corresponding to whole retma unit increments;
   the mounting bracket body defines a second set of at least one hole for receiving an attachment mechanism to secure the mounting bracket to the vertical rack structure at positions corresponding to half retma unit increments.

43. The mounting bracket of claim 40 wherein:
   the first alignment structure has a first edge and a second edge, the first edge of the first alignment structure is approximately 0.1 inches from the second edge;
   the second alignment structure has a first edge and a second edge, the first edge of the second alignment structure is approximately 0.1 inches from the second edge of the second alignment structure.

44. The mounting bracket of claim 43 wherein the first edge of the first alignment structure is approximately 0.876 inches from the first edge of the second alignment structure and the second edge of the first alignment structure is approximately 0.876 inches from the second edge of the second alignment structure.

45. The mounting bracket of claim 43 wherein the first edge of the first alignment structure is approximately 1.12 inches from the first edge of the second alignment structure and the second edge of the first alignment structure is approximately 1.12 inches from the second edge of the second alignment structure.

46. A method for assembling an electronics rack comprising:
   determining a position to secure a mounting bracket to a vertical rail structure of an electronics rack, the vertical rack structure defining a plurality of mounting holes spaced along the vertical rack structure to define mounting unit increments of the rack, the determined position to secure the mounting bracket being determined from positions corresponding to whole unit mounting increments and from positions corresponding to half unit mounting increments;
   aligning the mounting bracket against the rail structure in the determined position, the mounting bracket including a first and a second alignment structures each engaging a mounting hole of the plurality of mounting holes so as to align the bracket in the determined position, the first alignment structure and the second alignment structure being spaced apart such that the bracket is alignable along the rack structure both at the positions corresponding to whole mounting unit increments and at the positions corresponding to half mounting unit increments; and
   securing the bracket to the vertical rack structure at the determined position.

47. The method of claim 46 further comprising:
   mounting a computer system in the rack, the computer system being supported in the rack by at least one structure secured to the vertical rack structure via the mounting bracket.

48. The method of claim 46 wherein the plurality of holes are spaced along the vertical rack structure in a pattern substantially conforming to an Electronics Industry Association (EIA) standard.

49. A mounting bracket for a rack having defined mounting unit increments comprising:
   a mounting bracket body; and
   means for aligning the mounting bracket along a rack structure of the rack both at positions corresponding to whole mounting unit increments and at positions corresponding to half mounting unit increments;
   wherein the defined mounting unit increments substantially conform to an Electronics Industry Association (EIA) standard.

* * * * *